United States Patent
Huang et al.

(10) Patent No.: US 11,335,401 B1
(45) Date of Patent: May 17, 2022

(54) MEMORY UNIT WITH MULTIPLE WORD LINES FOR NONVOLATILE COMPUTING-IN-MEMORY APPLICATIONS AND CURRENT CALIBRATING METHOD THEREOF

(71) Applicant: NATIONAL TSING HUA UNIVERSITY, Hsinchu (TW)

(72) Inventors: Yen-Hsiang Huang, Hsinchu (TW); Sheng-Po Huang, Hsinchu (TW); Cheng-Xin Xue, Hsinchu (TW); Meng-Fan Chang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 17/161,618

(22) Filed: Jan. 28, 2021

(51) Int. Cl.
*G11C 13/00* (2006.01)

(52) U.S. Cl.
CPC ...... *G11C 13/0028* (2013.01); *G11C 13/0026* (2013.01); *G11C 13/0038* (2013.01); *G11C 2213/79* (2013.01)

(58) Field of Classification Search
None
See application file for complete search history.

(56) References Cited

U.S. PATENT DOCUMENTS

| | | | | |
|---|---|---|---|---|
| 10,340,003 | B1* | 7/2019 | Chang | G11C 7/1006 |
| 10,510,406 | B1* | 12/2019 | Chang | G11C 13/0064 |
| 10,832,783 | B1* | 11/2020 | Wei | G11C 11/1673 |
| 11,195,090 | B1* | 12/2021 | Chang | G06N 3/0635 |
| 2016/0358661 | A1* | 12/2016 | Vali | G06N 3/063 |
| 2017/0330602 | A1* | 11/2017 | Zhou | G11C 29/028 |
| 2019/0221263 | A1* | 7/2019 | Lee | G11C 16/08 |
| 2020/0194049 | A1* | 6/2020 | Nikonov | G06N 3/0635 |
| 2021/0035637 | A1* | 2/2021 | Capecchi | G11C 13/0004 |
| 2021/0209457 | A1* | 7/2021 | Tran | G11C 16/3463 |

* cited by examiner

*Primary Examiner* — J. H. Hur
(74) *Attorney, Agent, or Firm* — CKC & Partners Co., LLC

(57) ABSTRACT

A memory unit with multiple word lines for a plurality of non-volatile computing-in-memory applications is configured to compute a plurality of input signals and a plurality of weights. The memory unit includes a non-volatile memory cell array, a replica non-volatile memory cell array and a multi-row current calibration circuit. The non-volatile memory cell array is configured to generate a bit-line current. The replica non-volatile memory cell array includes a plurality of replica non-volatile memory cells and is configured to generate a calibration current. Each of the replica non-volatile memory cells is in the high resistance state. The multi-row current calibration circuit is electrically connected to the non-volatile memory cell array and the replica non-volatile memory cell array. The multi-row current calibration circuit is configured to subtract the calibration current from a dataline current to generate a calibrated dataline current. The dataline current is equal to the bit-line current.

20 Claims, 5 Drawing Sheets

MEMORY UNIT WITH MULTIPLE WORD LINES FOR NONVOLATILE COMPUTING-IN-MEMORY APPLICATIONS AND CURRENT CALIBRATING METHOD THEREOF

BACKGROUND

Technical Field

The present disclosure relates to a memory unit for a plurality of non-volatile computing-in-memory applications and a current calibrating method thereof. More particularly, the present disclosure relates to a memory unit with multiple word lines for a plurality of non-volatile computing-in-memory applications and a current calibrating method thereof.

Description of Related Art

In these years, due to the industrial growth of mobile device, medical electrical equipment, portable storage, etc., requirement of memory with low power, high speed and high density is increased. Computation-In-Memory (CIM) is a promising solution to improve the energy efficiency of multiply-and-accumulate (MAC) operations for artificial intelligence (AI) chips, and multiple-bit convolutional neural network (CNN) is required for high inference accuracy in many applications.

In order to increase the bandwidth and reduce the power consumption of each operation, CIM would turn on multiple word lines (WL) in a memory array to perform calculations at the same time. The accumulation of computing result on a bit line (BL) or a source line (SL) is one of the current development directions. However, using non-volatile memory (NVM) as computation platform has a few drawbacks. The most important drawback is that the resistance of neighboring states is so close (i.e., small R-ratio), result in the negative effect on the accumulation result on the bit line or the source line. The high resistance state current is also included while performing accumulation on the bit line. While activating the multiple word lines, the accumulation result on the bit line would be highly affected by the R-ratio of chosen NVM device. Therefore, reducing the error rate of CIM is one of the challenges to achieve high bandwidth and low power consumption while using NVM platform.

One conventional real-time CIM current calibration technology is only a single word line to be turned on, and then predicting the memory cell between the bit line and the source line which is in the high resistance state (HRS) or a low resistance state (LRS). If the memory cell is in the HRS, the current will not be used for calculation during MAC computation. The conventional real-time CIM current calibration technology can only perform a one-bit HRS and LRS prediction, so it cannot be calibrated when more than one word line is turned on. In the conventional real-time CIM current calibration technology, only a single word line can be turned on, thus greatly limiting the memory bandwidth and average power consumption for reading single memory cell.

Another conventional calibration technology of turning on multiple word lines non-real-time memory calculation currents is to integrate the charge, and after the calculation information is accumulated, turn on the high-impedance storage unit to eliminate the accumulated charge generated by the high-impedance state. The another conventional calibration technology that operates in this way has two key disadvantages. First, the another conventional calibration technology takes extra time to eliminate the interference information generated by the high-impedance state, so a cycle must be lengthened and throughput is reduced. Second, the implementation and application are limited. Because the information given to the next level circuit by its implement way can only be voltage signals, the another conventional calibration technology cannot be directly used by the next level circuit in current form. The accumulation result in peripheral circuits needs to be a voltage type, thus limiting the overall implementation.

Therefore, a memory unit with multiple word lines for a plurality of non-volatile computing-in-memory applications and a current calibrating method thereof having the features of turning on the multiple word lines, enabling the calibration of the multiple word lines, increasing the throughput, and achieving larger signal margin, low power consumption overhead and low area overhead are commercially desirable.

SUMMARY

According to one aspect of the present disclosure, a memory unit with multiple word lines for a plurality of non-volatile computing-in-memory applications is configured to compute a plurality of input signals and a plurality of weights. The memory unit with the multiple word lines for the plurality of non-volatile computing-in-memory applications includes a non-volatile memory cell array, a replica non-volatile memory cell array and a multi-row current calibration circuit. The non-volatile memory cell array is configured to generate a bit-line current and includes a plurality of non-volatile memory cells. The non-volatile memory cells are controlled by the multiple word lines to generate a plurality of memory cell currents and stores the weights. The multiple word lines transmit the input signals. Each of the non-volatile memory cells is in one of a high resistance state and a low resistance state, and the bit-line current is equal to a sum of the memory cell currents. The replica non-volatile memory cell array is configured to generate a calibration current and includes a plurality of replica non-volatile memory cells. The replica non-volatile memory cells are controlled by the multiple word lines to generate a plurality of replica memory cell currents. Each of the replica non-volatile memory cells is in the high resistance state, and the calibration current is equal to a sum of the replica memory cell currents. The multi-row current calibration circuit is electrically connected to the non-volatile memory cell array and the replica non-volatile memory cell array. The multi-row current calibration circuit is configured to subtract the calibration current from the bit-line current to generate a calibrated dataline current.

According to another aspect of the present disclosure, a current calibrating method of the memory unit with the multiple word lines for the plurality of non-volatile computing-in-memory applications includes performing a voltage level applying step and a current calibrating step. The voltage level applying step includes applying a plurality of voltage levels to the input signals. The current calibrating step includes driving the non-volatile memory cell array to generate a bit-line current, driving the replica non-volatile memory cell array to generate a calibration current, and driving the multi-row current calibration circuit to subtract the calibration current from the bit-line current to generate a calibrated dataline current.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage GND. A PMOS transistor and an NMOS transistor represent a P-type MOS transistor and an N-type MOS transistor, respectively. Each transistor has a source, a drain and a gate.

Figure 1:
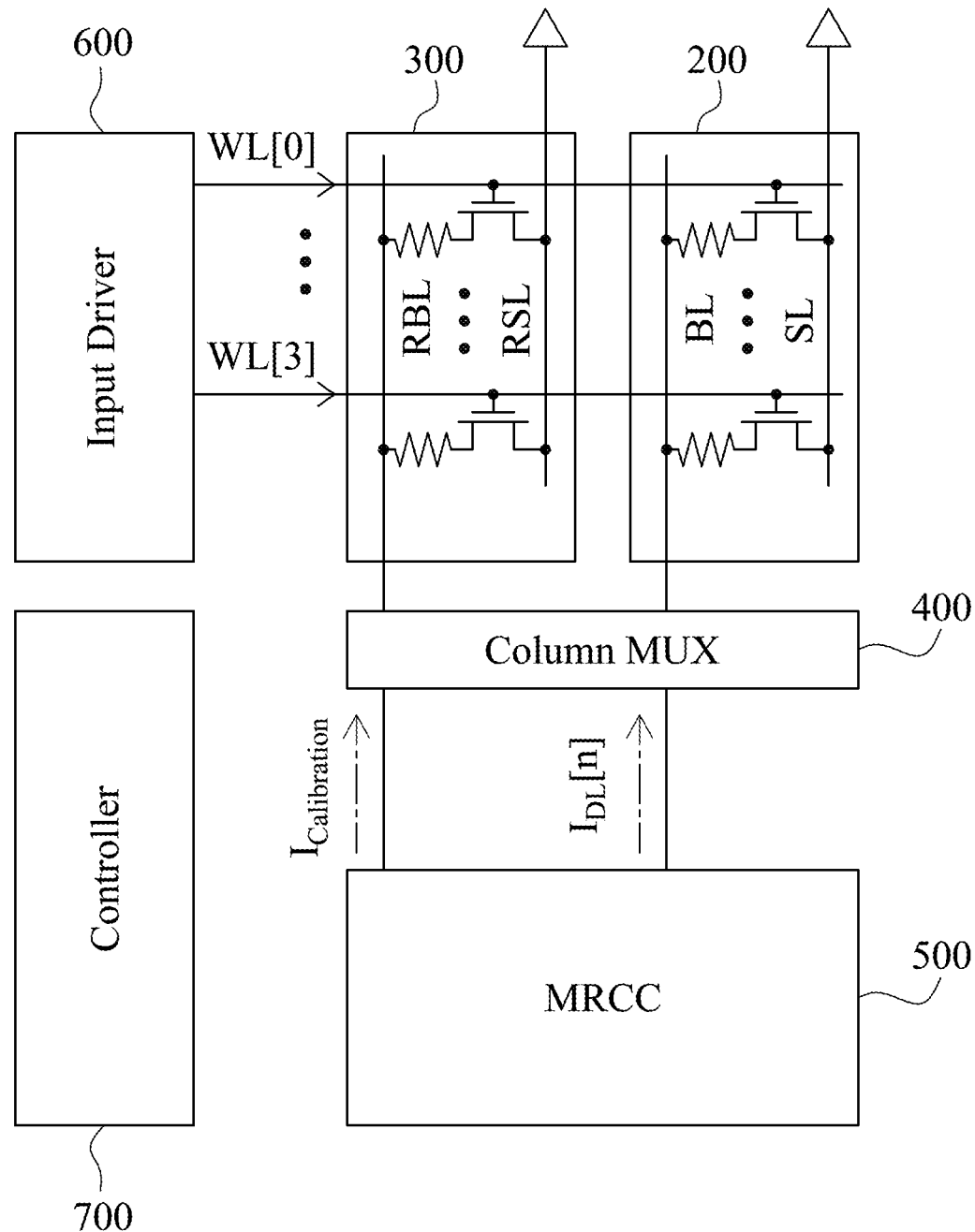
FIG. 1 shows a block diagram of a memory unit with multiple word lines for a plurality of non-volatile computing-in-memory applications according to a first embodiment of the present disclosure.
Figure 2:
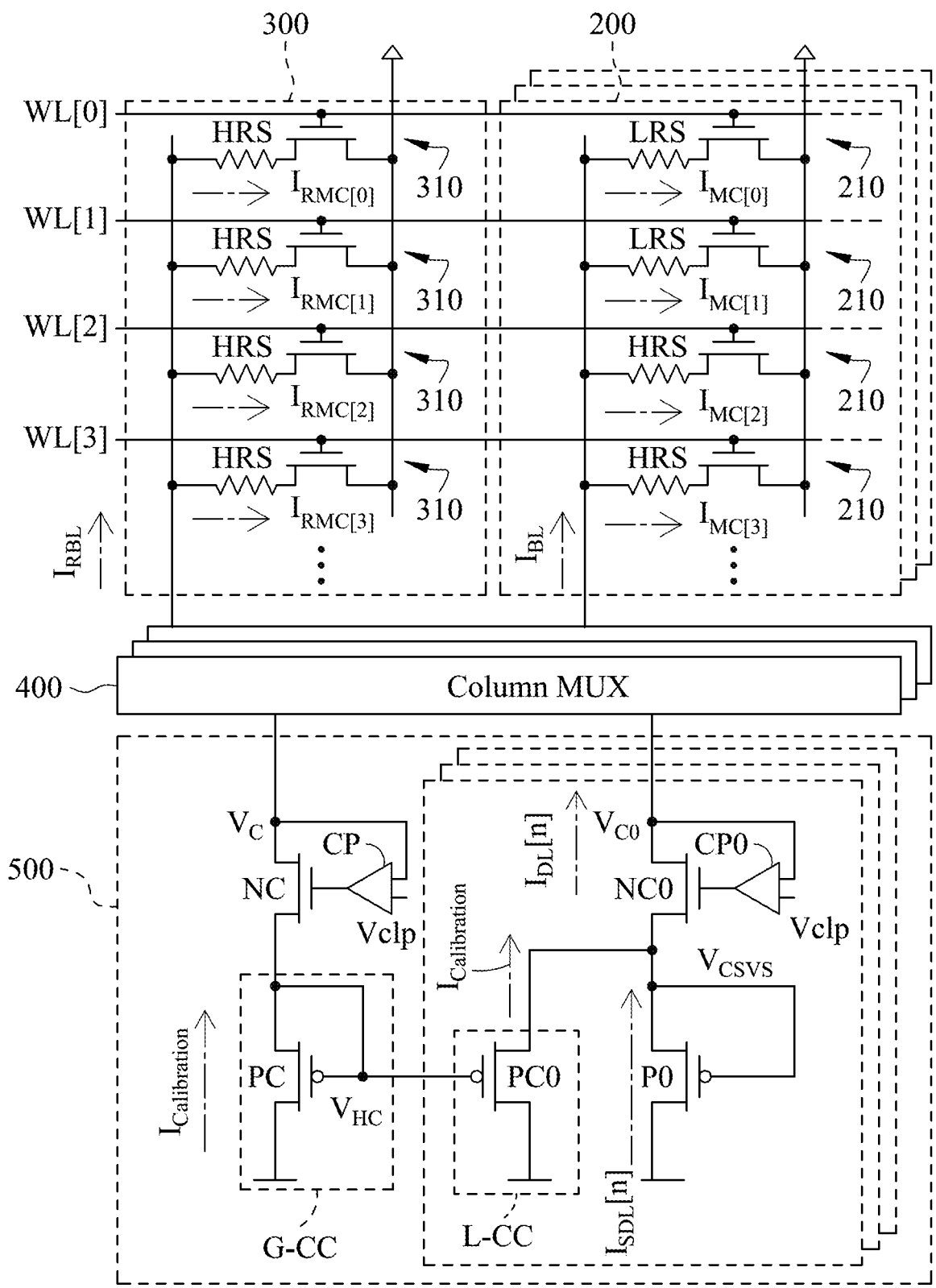
FIG. 2 shows a block diagram of a non-volatile memory cell array, a replica non-volatile memory cell array, a column multiplexer and a multi-row current calibration (MRCC) circuit of the memory unit of FIG. 1.

FIG. 1 shows a block diagram of a memory unit 100 with multiple word lines WL[0]-WL[3] (i.e., the multiple word lines WL[0], WL[1], WL[2], WL[3] in FIG. 2) for a plurality of non-volatile computing-in-memory (nvCIM) applications according to a first embodiment of the present disclosure. FIG. 2 shows a block diagram of a non-volatile memory cell array 200, a replica non-volatile memory cell array 300, a column multiplexer 400 and a multi-row current calibration (MRCC) circuit 500 of the memory unit 100 of FIG. 1. In FIGS. 1 and 2, the memory unit 100 with the multiple word lines WL[0]-WL[3] for the plurality of nvCIM applications is configured to compute a plurality of input signals and a plurality of weights. The memory unit 100 with the multiple word lines WL[0]-WL[3] for the plurality of nvCIM applications includes the non-volatile memory cell array 200, the replica non-volatile memory cell array 300, the column multiplexer 400, the MRCC circuit 500, a word line driver 600 and a controller 700.

The non-volatile memory cell array 200 is configured to generate a bit-line current $I_{BL}$ and includes a plurality of non-volatile memory cells 210, a source line SL and a bit line BL. The non-volatile memory cells 210 are controlled by the multiple word lines WL[0]-WL[3] to generate a plurality of memory cell currents $I_{MC[0]}$, $I_{MC[1]}$, $I_{MC[2]}$, $I_{MC[3]}$ and stores the weights. The multiple word lines WL[0]-WL[3] transmit the input signals. Each of the non-volatile memory cells 210 is in one of a high resistance state (HRS) and a low resistance state (LRS), and the bit-line current $I_{BL}$ is equal to a sum of the memory cell currents $I_{MC[0]}$-$I_{MC[3]}$. Each of the non-volatile memory cells 210 includes a resistive element and a transistor. The resistive element is electrically connected to the bit line BL and stores one of the weights. The transistor is electrically connected between the resistive element and the source line SL. The source line SL is coupled to the ground voltage GND. The resistive element is in one of the HRS and the LRS. The transistor is the NMOS transistor. The source line SL is electrically connected to one end of each of the non-volatile memory cells 210. The bit line BL is electrically connected to another end of each of the non-volatile memory cells 210. The bit-line current $I_{BL}$ flows through the bit line BL. In one embodiment, each of the non-volatile memory cells 210 may be a 1-transistor 1-resistor (1T1R) ReRAM cell. The number of the non-volatile memory cell array 200 may be plural.

The replica non-volatile memory cell array 300 is configured to generate a calibration current $I_{Calibration}$ and includes a plurality of replica non-volatile memory cells 310, a replica source line RSL and a replica bit line RBL. The replica non-volatile memory cells 310 are controlled by the multiple word lines WL[0]-WL[3] to generate a plurality of replica memory cell currents $I_{RMC[0]}$, $I_{RMC[1]}$, $I_{RMC[2]}$, $I_{RMC[3]}$. Each of the replica non-volatile memory cells 310 is in the HRS, and the calibration current $I_{Calibration}$ is equal to a sum (i.e., $I_{RBL}$) of the replica memory cell currents $I_{RMC[0]}$-$I_{RMC[3]}$. The number of the non-volatile memory cells 210 is equal to the number of the replica non-volatile memory cells 310. Each of the replica non-volatile memory cells 310 includes a replica resistive element and a replica transistor. The replica resistive element is electrically connected to the replica bit line RBL. The replica resistive element is in the HRS. The replica transistor is electrically connected between the replica resistive element and the replica source line RSL. The replica source line RSL is coupled to the ground voltage GND. The replica resistive element is in the HRS. The replica transistor is the NMOS transistor. The replica source line RSL is electrically connected to one end of each of the replica non-volatile memory cells 310. The replica bit line RBL is electrically connected to another end of each of the replica non-volatile memory cells 310. The calibration current $I_{Calibration}$ flows through the replica bit line RBL.

The column multiplexer 400 is electrically connected between each of the non-volatile memory cells 210 and the MRCC circuit 500. The column multiplexer 400 is electrically connected between each of the replica non-volatile memory cells 310 and the MRCC circuit 500. The column multiplexer 400 is represented by "Column MUX" and is located on a bottom side of the non-volatile memory cell array 200 and a bottom side of the replica non-volatile memory cell array 300. The column multiplexer 400 receives the bit-line current $I_{BL}$ and generates a dataline current $I_{DL}[n]$ according to the bit-line current $I_{BL}$. The dataline current $I_{DL}[n]$ may be equal to the bit-line current $I_{BL}$. n represents an integer value, such as 0-63. In one embodiment, the column multiplexer 400 may be an 8-to-1 column multiplexer.

The MRCC circuit 500 is electrically connected to the non-volatile memory cell array 200 and the replica non-volatile memory cell array 300. The MRCC circuit 500 is configured to subtract the calibration current $I_{Calibration}$ from the bit-line current $I_{BL}$ to generate a calibrated dataline current $I_{SDL}[n]$. In detail, the MRCC circuit 500 includes a first global calibration transistor NC, a global comparator CP, a global calibration circuit G-CC, a first local calibration transistor NC0, a local comparator CP0, a local calibration circuit L-CC and a dataline transistor P0. The first global calibration transistor NC is electrically connected to the column multiplexer 400 via a global detecting node having a voltage level $V_C$. The global comparator CP is electrically connected to the first global calibration transistor NC and the global detecting node. The global comparator CP generates a comparison output by comparing the voltage level $V_C$ of the global detecting node with a clamping voltage Vclp, and the first global calibration transistor NC is controlled by the comparison output. The global calibration circuit G-CC is electrically connected between the first global calibration transistor NC and the power supply voltage VDD. The calibration current $I_{Calibration}$ flows through the first global calibration transistor NC and the global calibration circuit G-CC. The first local calibration transistor NC0 is electrically connected to the column multiplexer 400 via a local detecting node having a voltage level $V_{C0}$. The dataline current $I_D[n]$ flows through the first local calibration transistor NC0. The local comparator CP0 is electrically connected to the first local calibration transistor NC0 and the local detecting node. The local comparator CP0 generates a comparison output by comparing the voltage level $V_{C0}$ of the local detecting node with the clamping voltage Vclp, and the first local calibration transistor NC0 is controlled by the comparison output. The local calibration circuit L-CC is electrically connected between the first local calibration transistor NC0 and the power supply voltage VDD. The calibration current $I_{Calibration}$ flows through the local calibration circuit L-CC. The dataline transistor P0 is electrically connected between the first local calibration transistor NC0 and the power supply voltage VDD. The dataline transistor P0 is electrically connected to the local calibration circuit L-CC, and the calibrated dataline current $I_{SDL}[n]$ flows through the dataline transistor P0.

The first global calibration transistor NC has a first global calibration gate, a first global calibration drain and a first global calibration source. The first global calibration gate is coupled to the comparison output of the global comparator CP. The first global calibration drain is coupled to the global calibration circuit G-CC, and the first global calibration source is coupled to the global detecting node. The global calibration circuit G-CC includes a second global calibration transistor PC. The second global calibration transistor PC has a second global calibration gate, a second global calibration drain and a second global calibration source. The second global calibration gate is coupled to the second global calibration drain. The second global calibration drain is coupled to the first global calibration transistor NC, and the second global calibration source is coupled to the power supply voltage VDD. The first global calibration transistor NC is the NMOS transistor. The second global calibration transistor PC is the PMOS transistor.

The first local calibration transistor NC0 has a first local calibration gate, a first local calibration drain and a first local calibration source. The first local calibration gate is coupled to the comparison output of the local comparator CP0. The first local calibration drain is coupled to the local calibration circuit L-CC and the dataline transistor P0, and the first local calibration source is coupled to the local detecting node. The local calibration circuit L-CC includes a second local calibration transistor PC0. The second local calibration transistor PC0 has a second local calibration gate, a second local calibration drain and a second local calibration source. The second local calibration gate is coupled to a calibration voltage $V_{HC}$. The second local calibration drain is coupled to the first local calibration transistor NC0, and the second local calibration source is coupled to the power supply voltage VDD. The second global calibration gate of the second global calibration transistor PC is coupled to the second local calibration gate of the second local calibration transistor PC0. In addition, the dataline transistor P0 has a local dataline gate, a local dataline drain and a local dataline source. The local dataline gate is coupled to the local dataline drain. The local dataline drain is coupled to the first local calibration transistor NC0, and the local dataline source is coupled to the power supply voltage VDD. The second local calibration drain of the second local calibration transistor PC0, the first local calibration drain of the first local calibration transistor NC0 and the local dataline drain of the dataline transistor P0 are coupled to each other via a local inner node having a voltage level $V_{CSVS}$. The first local calibration transistor NC0 is the NMOS transistor. Each of the second local calibration transistor PC0 and the dataline transistor P0 is the PMOS transistor.

The word line driver 600 is connected to the non-volatile memory cells 210 and the replica non-volatile memory cells 310 via the multiple word lines WL[0]-WL[3]. The word line driver 600 is represented by "Input Driver" and is located on a left side of the replica non-volatile memory cell array 300. The word line driver 600 generates the voltage levels of the input signals to control each of the non-volatile memory cells 210 and the replica non-volatile memory cells 310 via the multiple word lines WL[0]-WL[3].

The controller 700 is electrically connected to the column multiplexer 400 and the MRCC circuit 500. The controller 700 is represented by "Controller" and is located on a bottom side of the word line driver 600. The controller 700 is configured to control the column multiplexer 400 and the MRCC circuit 500 to generate the calibrated dataline current $I_{SDL}[n]$.

Figure 3:
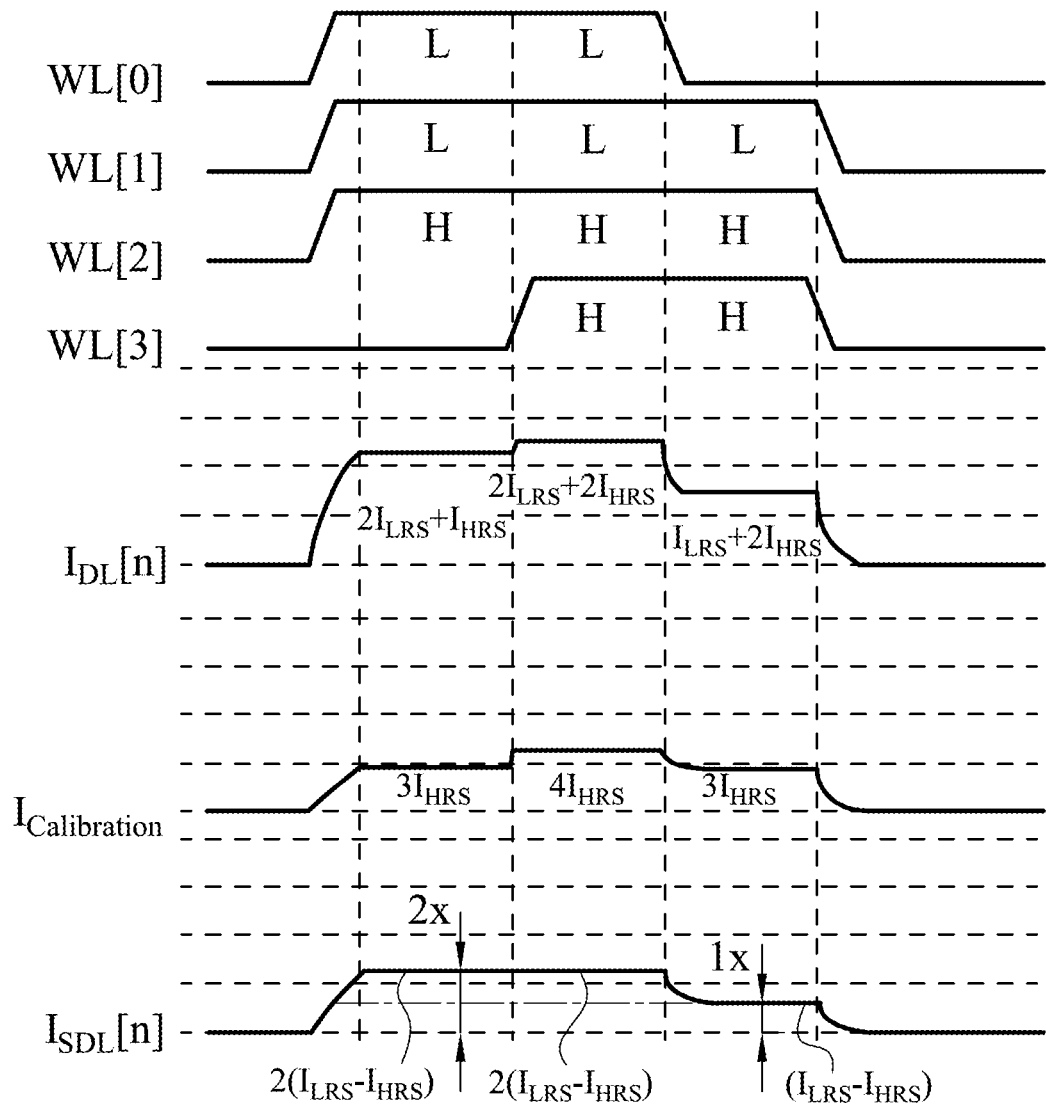
FIG. 3 shows timing diagrams of the memory unit of FIG. 1.

Please refer to FIGS. 1-3. FIG. 3 shows timing diagrams of the memory unit 100 of FIG. 1. The multiple word lines WL[0]-WL[3] include a first word line WL[0], a second word line WL[1], a third word line WL[2] and a fourth word line WL[3]. In the non-volatile memory cell array 200, the non-volatile memory cells 210 include a first non-volatile memory cell, a second non-volatile memory cell, a third non-volatile memory cell and a fourth non-volatile memory cell. The memory cell currents $I_{MC[0]}$, $I_{MC[1]}$, $I_{MC[2]}$, $I_{MC[3]}$ flow through the first non-volatile memory cell, the second non-volatile memory cell, the third non-volatile memory cell and the fourth non-volatile memory cell, respectively. The first non-volatile memory cell and the second non-volatile memory cell are in the LRS. The third non-volatile memory cell and the fourth non-volatile memory cell are in the HRS. In the replica non-volatile memory cell array 300, the replica non-volatile memory cells 310 are all in the HRS.

During a first time interval of FIG. 3, the four input signals of the first word line WL[0], the second word line WL[1], the third word line WL[2] and the fourth word line WL[3] are equal to 1, 1, 1 and 0, respectively. The dataline current $I_{DL}[n]$ is equal to $2I_{LRS}+I_{HRS}$. The calibration current $I_{Calibration}$ is equal to $3I_{HRS}$. The calibrated dataline current $I_{SDL}[n]$ is equal to $2(I_{LRS}-I_{HRS})$.

During a second time interval of FIG. 3, the four input signals of the first word line WL[0], the second word line WL[1], the third word line WL[2] and the fourth word line WL[3] are all equal to 1. The dataline current $I_{DL}[n]$ is equal to $2I_{LRS}+2I_{HRS}$. The calibration current $I_{Calibration}$ is equal to $4I_{HRS}$. The calibrated dataline current $I_{SDL}[n]$ is equal to $2(I_{LRS}-I_{HRS})$.

During a third time interval of FIG. 3, the four input signals of the first word line WL[0], the second word line WL[1], the third word line WL[2] and the fourth word line WL[3] are equal to 0, 1, 1 and 1, respectively. The dataline current $I_{DL}[n]$ is equal to $I_{LRS}+2I_{HRS}$. The calibration current $I_{Calibration}$ is equal to $3I_{HRS}$. The calibrated dataline current $I_{SDL}[n]$ is equal to $I_{LRS}-I_{HRS}$.

Table 1 lists a truth table of the dataline current $I_{DL}[n]$, the calibration current $I_{Calibration}$ and the calibrated dataline current $I_{SDL}[n]$ of the MRCC circuit 500 according to the number of the multiple word lines to be turned on (i.e., Turn on WL number) and the states (i.e., the HRS or the LRS) of the non-volatile memory cells 210 of the non-volatile memory cell array 200 and the replica non-volatile memory cells 310 of the replica non-volatile memory cell array 300. It is obvious that the calibration current $I_{Calibration}$ is proportional to the number of the multiple word lines WL[0]-WL[3] which are turned on by the input signals. The calibrated dataline current $I_{SDL}[n]$ is proportional to the number of the non-volatile memory cells 210 which are in the LRS. The calibrated dataline current $I_{SDL}[n]$ can be described as follows:

$$I_{SDL}[n]=I_{DL}[n]-I_{Calibration}$$

TABLE 1

| Turn on WL number | Cell | $I_{DL}[n]$ | $I_{Calibration}$ | $I_{SDL}[n]$ |
|---|---|---|---|---|
| 0 | HRS/LRS | 0 | 0 | 0 |
| 1 | HRS | $I_{HRS}$ | $I_{HRS}$ | 0 |
|   | LRS | $I_{LRS}$ |   | $I_{LRS}-I_{HRS}$ |
| 2 | 2HRS | $2I_{HRS}$ | $2I_{HRS}$ | 0 |
|   | HRS & LRS | $I_{HRS}+I_{LRS}$ |   | $I_{LRS}-I_{HRS}$ |
|   | 2LRS | $2I_{LRS}$ |   | $2(I_{LRS}-I_{HRS})$ |
| 3 | 3HRS | $3I_{HRS}$ | $3I_{HRS}$ | 0 |
|   | 2HRS & LRS | $2I_{HRS}+I_{LRS}$ |   | $I_{LRS}-I_{HRS}$ |
|   | HRS & 2LRS | $I_{HRS}+2I_{LRS}$ |   | $2(I_{LRS}-I_{HRS})$ |
|   | 3LRS | $3I_{LRS}$ |   | $3(I_{LRS}-I_{HRS})$ |
| 4 | 4HRS | $4I_{HRS}$ | $4I_{HRS}$ | 0 |
|   | 3HRS & LRS | $3I_{HRS}+I_{LRS}$ |   | $I_{LRS}-I_{HRS}$ |
|   | 2HRS & 2LRS | $2I_{HRS}+2I_{LRS}$ |   | $2(I_{LRS}-I_{HRS})$ |
|   | HRS & 3LRS | $I_{HRS}+3I_{LRS}$ |   | $3(I_{LRS}-I_{HRS})$ |
|   | 4LRS | $4I_{LRS}$ |   | $4(I_{LRS}-I_{HRS})$ |

Therefore, the memory unit 100 with the multiple word lines WL[0]-WL[3] for the plurality of nvCIM applications of the present disclosure can generate a corresponding calibration current $I_{Calibration}$ based on the number of the activated multiple word lines (i.e., the multiple word lines to be turned on) to eliminate the accumulation errors caused by the superposition of the memory cell currents $I_{MC[0]}$-$I_{MC[3]}$ of the non-volatile memory cells 210 with the HRS and the LRS.

Figure 4:
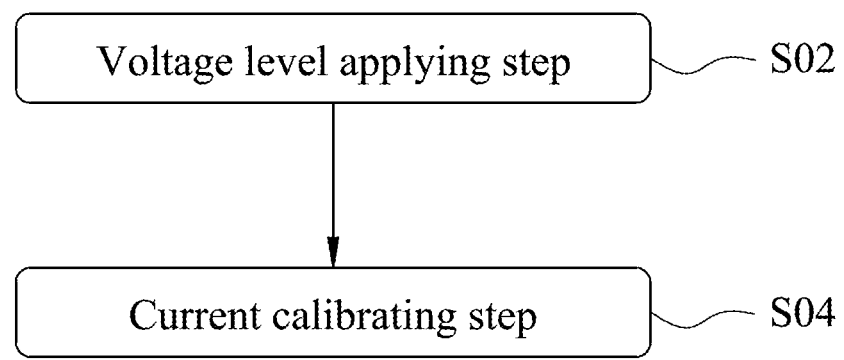
FIG. 4 shows a flow chart of a current calibrating method of a memory unit with multiple word lines for a plurality of non-volatile computing-in-memory applications according to a second embodiment of the present disclosure.

Please refer to FIGS. 1, 2 and 4. FIG. 4 shows a flow chart of a current calibrating method 800 of a memory unit 100 with multiple word lines WL[0]-WL[3] for a plurality of nvCIM applications according to a second embodiment of the present disclosure. The current calibrating method 800 of the memory unit 100 with the multiple word lines WL[0]-WL[3] for the plurality of nvCIM applications includes performing a voltage level applying step S02 and a current calibrating step S04. The voltage level applying step S02 includes applying a plurality of voltage levels to the input signals. The multiple word lines WL[0]-WL[3] transmit the input signals. The current calibrating step S04 includes driving the non-volatile memory cell array 200 to generate a bit-line current $I_{BL}$, driving the replica non-volatile memory cell array 300 to generate a calibration current $I_{Calibration}$, and driving the MRCC circuit 500 to subtract the calibration current $I_{Calibration}$ from the bit-line current $I_{BL}$ to generate a calibrated dataline current $I_{SDL}[n]$. In other words, the MRCC circuit 500 is configured to subtract the calibration current $I_{Calibration}$ from the dataline current $I_{DL}[n]$ to generate the calibrated dataline current $I_{SDL}[n]$ because the dataline current $I_{DL}[n]$ is equal to the bit-line current $I_{BL}$.

The voltage level applying step S02 further includes applying the ground voltage GND to the source line SL and the replica source line RSL, applying the clamping voltage Vclp to the global comparator CP and to the local comparator CP0, and applying the power supply voltage VDD to the second global calibration source of the second global calibration transistor PC, the second local calibration source of the second local calibration transistor PC0 and the local dataline source of the dataline transistor P0.

Accordingly, the current calibrating method 800 of the memory unit 100 with the multiple word lines WL[0]-WL[3] for the plurality of nvCIM applications of the present disclosure can generate a corresponding calibration current $I_{Calibration}$ based on the number of the activated multiple word lines WL[0]-WL[3] to eliminate the accumulation errors caused by the superposition of the memory cell currents $I_{MC[0]}$-$I_{MC[3]}$ of the non-volatile memory cells 210 with the HRS and the LRS.

Figure 5:
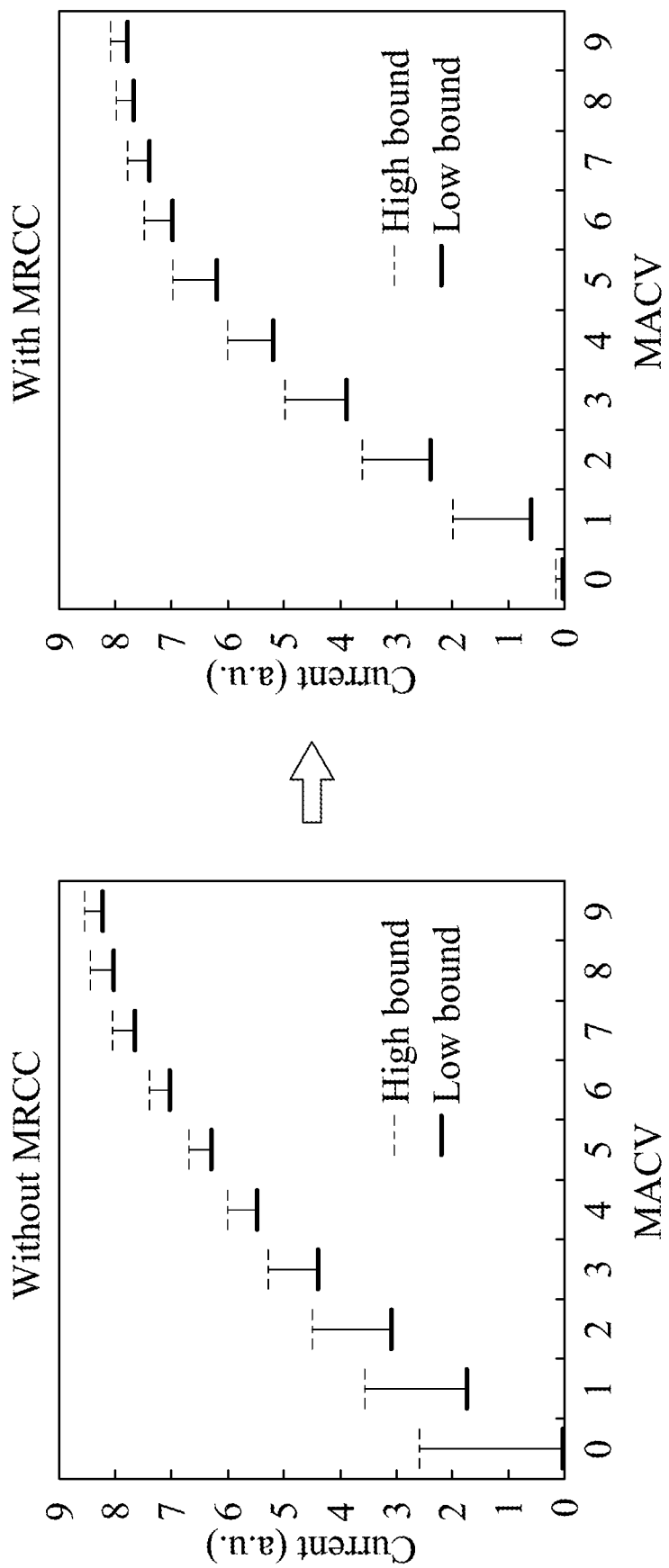
FIG. 5 shows a comparison result of current distributions between the memory unit with the MRCC circuit of the present disclosure and a conventional memory unit without the MRCC circuit.

Please refer to FIGS. 1, 2 and 5. FIG. 5 shows a comparison result of current distributions between the memory unit 100 with the MRCC circuit 500 of the present disclosure and a conventional memory unit without the MRCC circuit 500. In FIG. 5, the 1-bit input signals and the 1-bit weights are used to generate the comparison result of the current distributions with 9 accumulation. The conventional memory unit without the MRCC circuit 500 provides bad information quality from multiply and accumulation results, thereby achieving no sensing margin between different results. The memory unit 100 with the MRCC circuit 500 of the present disclosure provides excellent information quality from multiply and accumulation results, thereby achieving large sensing margin between different results.

According to the aforementioned embodiments and examples, the advantages of the present disclosure are described as follows.

1. The memory unit with the multiple word lines for the plurality of nvCIM applications and the current calibrating method thereof of the present disclosure have the features of turning on the multiple word lines at the same time, enabling the calibration of the multiple word lines, increasing the throughput, and achieving larger signal margin, low power consumption overhead and low area overhead.

2. The memory unit with the multiple word lines for the plurality of nvCIM applications and the current calibrating method thereof of the present disclosure can generate a corresponding calibration current based on the number of the activated multiple word lines to eliminate the accumulation errors caused by the superposition of the memory cell currents of the non-volatile memory cells with the HRS and the LRS.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory unit with multiple word lines for a plurality of non-volatile computing-in-memory applications, which is configured to compute a plurality of input signals and a plurality of weights, and the memory unit with the multiple word lines for the plurality of non-volatile computing-in-memory applications comprising:
    a non-volatile memory cell array configured to generate a bit-line current and comprising:
        a plurality of non-volatile memory cells controlled by the multiple word lines to generate a plurality of memory cell currents and storing the weights, wherein the multiple word lines transmit the input signals, each of the non-volatile memory cells is in one of a high resistance state and a low resistance state, and the bit-line current is equal to a sum of the memory cell currents; and
    a replica non-volatile memory cell array configured to generate a calibration current and comprising:
        a plurality of replica non-volatile memory cells controlled by the multiple word lines to generate a plurality of replica memory cell currents, wherein each of the replica non-volatile memory cells is in the high resistance state, and the calibration current is equal to a sum of the replica memory cell currents; and
    a multi-row current calibration circuit electrically connected to the non-volatile memory cell array and the replica non-volatile memory cell array, wherein the multi-row current calibration circuit is configured to subtract the calibration current from the bit-line current to generate a calibrated dataline current.

2. The memory unit with the multiple word lines for the plurality of non-volatile computing-in-memory applications of claim 1, wherein the non-volatile memory cell array further comprises:
    a source line electrically connected to one end of each of the non-volatile memory cells; and
    a bit line electrically connected to another end of each of the non-volatile memory cells, wherein the bit-line current flows through the bit line.

3. The memory unit with the multiple word lines for the plurality of non-volatile computing-in-memory applications of claim 2, wherein each of the non-volatile memory cells comprises:
    a resistive element electrically connected to the bit line and storing one of the weights, wherein the resistive element is in one of the high resistance state and the low resistance state; and
    a transistor electrically connected between the resistive element and the source line, wherein the source line is coupled to a ground voltage.

4. The memory unit with the multiple word lines for the plurality of non-volatile computing-in-memory applications of claim 1, wherein the replica non-volatile memory cell array further comprises:
    a replica source line electrically connected to one end of each of the replica non-volatile memory cells; and
    a replica bit line electrically connected to another end of each of the replica non-volatile memory cells, wherein the calibration current flows through the replica bit line.

5. The memory unit with the multiple word lines for the plurality of non-volatile computing-in-memory applications of claim 4, wherein each of the replica non-volatile memory cells comprises:
    a replica resistive element electrically connected to the replica bit line, wherein the replica resistive element is in the high resistance state; and
    a replica transistor electrically connected between the replica resistive element and the replica source line, wherein the replica source line is coupled to a ground voltage.

6. The memory unit with the multiple word lines for the plurality of non-volatile computing-in-memory applications of claim 1, further comprising:
    a column multiplexer electrically connected between each of the non-volatile memory cells and the multi-row current calibration circuit, wherein the column multiplexer is electrically connected between each of the replica non-volatile memory cells and the multi-row current calibration circuit, and the column multiplexer receives the bit-line current and generates a dataline current according to the bit-line current.

7. The memory unit with the multiple word lines for the plurality of non-volatile computing-in-memory applications of claim 6, wherein the multi-row current calibration circuit comprises:
    a first global calibration transistor electrically connected to the column multiplexer via a global detecting node;
    a global comparator electrically connected to the first global calibration transistor and the global detecting node, wherein the global comparator generates a comparison output by comparing a voltage level of the global detecting node with a clamping voltage, and the first global calibration transistor is controlled by the comparison output; and
    a global calibration circuit electrically connected between the first global calibration transistor and a power supply voltage;
    wherein the calibration current flows through the first global calibration transistor and the global calibration circuit.

8. The memory unit with the multiple word lines for the plurality of non-volatile computing-in-memory applications of claim 7, wherein,
    the first global calibration transistor has a first global calibration gate, a first global calibration drain and a first global calibration source, the first global calibration gate is coupled to the comparison output of the global comparator, the first global calibration drain is coupled to the global calibration circuit, and the first global calibration source is coupled to the global detecting node; and
    the global calibration circuit comprises a second global calibration transistor, the second global calibration transistor has a second global calibration gate, a second global calibration drain and a second global calibration source, the second global calibration gate is coupled to the second global calibration drain, the second global calibration drain is coupled to the first global calibration transistor, and the second global calibration source is coupled to the power supply voltage.

9. The memory unit with the multiple word lines for the plurality of non-volatile computing-in-memory applications of claim 6, wherein the multi-row current calibration circuit comprises:
    a first local calibration transistor electrically connected to the column multiplexer via a local detecting node, wherein the dataline current flows through the first local calibration transistor;
    a local comparator electrically connected to the first local calibration transistor and the local detecting node, wherein the local comparator generates a comparison output by comparing a voltage level of the local detecting node with a clamping voltage, and the first local calibration transistor is controlled by the comparison output;
    a local calibration circuit electrically connected between the first local calibration transistor and a power supply voltage, wherein the calibration current flows through the local calibration circuit; and
    a dataline transistor electrically connected between the first local calibration transistor and the power supply voltage, wherein the dataline transistor is electrically connected to the local calibration circuit, and the calibrated dataline current flows through the dataline transistor.

10. The memory unit with the multiple word lines for the plurality of non-volatile computing-in-memory applications of claim 9, wherein,
    the first local calibration transistor has a first local calibration gate, a first local calibration drain and a first local calibration source, the first local calibration gate is coupled to the comparison output of the local comparator, the first local calibration drain is coupled to the local calibration circuit and the dataline transistor, and the first local calibration source is coupled to the local detecting node;
    the local calibration circuit comprises a second local calibration transistor, the second local calibration transistor has a second local calibration gate, a second local calibration drain and a second local calibration source, the second local calibration gate is coupled to a calibration voltage, the second local calibration drain is coupled to the first local calibration transistor, and the second local calibration source is coupled to the power supply voltage; and
    the dataline transistor has a local dataline gate, a local dataline drain and a local dataline source, the local dataline gate is coupled to the local dataline drain, the local dataline drain is coupled to the first local calibration transistor, and the local dataline source is coupled to the power supply voltage.

11. The memory unit with the multiple word lines for the plurality of non-volatile computing-in-memory applications of claim 1, wherein,
    the calibration current is proportional to a number of the multiple word lines which are turned on by the input signals; and
    the calibrated dataline current is proportional to a number of the non-volatile memory cells which are in the low resistance state.

12. A current calibrating method of the memory unit with the multiple word lines for the plurality of non-volatile computing-in-memory applications of claim 1, comprising:
    performing a voltage level applying step, wherein the voltage level applying step comprises applying a plurality of voltage levels to the input signals; and
    performing a current calibrating step, wherein the current calibrating step comprises:
        driving the non-volatile memory cell array to generate the bit-line current;
        driving the replica non-volatile memory cell array to generate the calibration current; and
        driving the multi-row current calibration circuit to subtract the calibration current from the bit-line current to generate the calibrated dataline current.

13. The current calibrating method of claim 12, wherein in the current calibrating step,
    the non-volatile memory cell array further comprises:
        a source line electrically connected to one end of each of the non-volatile memory cells; and
        a bit line electrically connected to another end of each of the non-volatile memory cells, wherein the bit-line current flows through the bit line; and
    each of the non-volatile memory cells comprises:
        a resistive element electrically connected to the bit line and storing one of the weights, wherein the resistive element is in one of the high resistance state and the low resistance state; and
        a transistor electrically connected between the resistive element and the source line;
    wherein the voltage level applying step further comprises applying a ground voltage to the source line.

14. The current calibrating method of claim 12, wherein in the current calibrating step,
    the replica non-volatile memory cell array further comprises:
        a replica source line electrically connected to one end of each of the replica non-volatile memory cells; and
        a replica bit line electrically connected to another end of each of the replica non-volatile memory cells, wherein the calibration current flows through the replica bit line; and
    each of the replica non-volatile memory cells comprises:
        a replica resistive element electrically connected to the replica bit line, wherein the replica resistive element is in the high resistance state; and
        a replica transistor electrically connected between the replica resistive element and the replica source line;
    wherein the voltage level applying step further comprises applying a ground voltage to the replica source line.

15. The current calibrating method of claim 12, wherein the memory unit with the multiple word lines for the plurality of non-volatile computing-in-memory applications further comprises:
    a column multiplexer electrically connected between each of the non-volatile memory cells and the multi-row current calibration circuit, wherein the column multiplexer is electrically connected between each of the replica non-volatile memory cells and the multi-row current calibration circuit, and the column multiplexer receives the bit-line current and generates a dataline current according to the bit-line current.

16. The current calibrating method of claim 15, wherein in the current calibrating step, the multi-row current calibration circuit comprises:
    a first global calibration transistor electrically connected to the column multiplexer via a global detecting node;

a global comparator electrically connected to the first global calibration transistor and the global detecting node, wherein the global comparator generates a comparison output by comparing a voltage level of the global detecting node with a clamping voltage, and the first global calibration transistor is controlled by the comparison output; and a global calibration circuit electrically connected between the first global calibration transistor and a power supply voltage;

wherein the calibration current flows through the first global calibration transistor and the global calibration circuit, and the voltage level applying step further comprises applying the clamping voltage to the global comparator.

17. The current calibrating method of claim 16, wherein in the current calibrating step, the first global calibration transistor has a first global calibration gate, a first global calibration drain and a first global calibration source, the first global calibration gate is coupled to the comparison output of the global comparator, the first global calibration drain is coupled to the global calibration circuit, and the first global calibration source is coupled to the global detecting node; and the global calibration circuit comprises a second global calibration transistor, the second global calibration transistor has a second global calibration gate, a second global calibration drain and a second global calibration source, the second global calibration gate is coupled to the second global calibration drain, the second global calibration drain is coupled to the first global calibration transistor;

wherein the voltage level applying step further comprises applying the power supply voltage to the second global calibration source.

18. The current calibrating method of claim 15, wherein in the current calibrating step, the multi-row current calibration circuit comprises:

a first local calibration transistor electrically connected to the column multiplexer via a local detecting node, wherein the dataline current flows through the first local calibration transistor;

a local comparator electrically connected to the first local calibration transistor and the local detecting node, wherein the local comparator generates a comparison output by comparing a voltage level of the local detecting node with a clamping voltage, and the first local calibration transistor is controlled by the comparison output;

a local calibration circuit electrically connected between the first local calibration transistor and a power supply voltage, wherein the calibration current flows through the local calibration circuit; and a dataline transistor electrically connected between the first local calibration transistor and the power supply voltage, wherein the dataline transistor is electrically connected to the local calibration circuit, and the calibrated dataline current flows through the dataline transistor;

wherein the voltage level applying step further comprises applying the clamping voltage to the local comparator.

19. The current calibrating method of claim 18, wherein in the current calibrating step, the first local calibration transistor has a first local calibration gate, a first local calibration drain and a first local calibration source, the first local calibration gate is coupled to the comparison output of the local comparator, the first local calibration drain is coupled to the local calibration circuit and the dataline transistor, and the first local calibration source is coupled to the local detecting node;

the local calibration circuit comprises a second local calibration transistor, the second local calibration transistor has a second local calibration gate, a second local calibration drain and a second local calibration source, the second local calibration gate is coupled to a calibration voltage, and the second local calibration drain is coupled to the first local calibration transistor; and the dataline transistor has a local dataline gate, a local dataline drain and a local dataline source, the local dataline gate is coupled to the local dataline drain, and the local dataline drain is coupled to the first local calibration transistor;

wherein the voltage level applying step further comprises applying the power supply voltage to the second local calibration source and the local dataline source.

20. The current calibrating method of claim 12, wherein, the calibration current is proportional to a number of the multiple word lines which are turned on by the input signals; and the calibrated dataline current is proportional to a number of the non-volatile memory cells which are in the low resistance state.

\* \* \* \* \*